United States Patent
Herdt et al.

(10) Patent No.: US 8,592,307 B2
(45) Date of Patent: *Nov. 26, 2013

(54) MODULATED DEPOSITION PROCESS FOR STRESS CONTROL IN THICK TIN FILMS

(75) Inventors: Gregory Charles Herdt, Plano, TX (US); Joseph W. Buckfeller, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/592,810

(22) Filed: Aug. 23, 2012

(65) Prior Publication Data

US 2012/0322258 A1    Dec. 20, 2012

Related U.S. Application Data

(63) Continuation of application No. 12/537,306, filed on Aug. 7, 2009.

(60) Provisional application No. 61/087,041, filed on Aug. 7, 2008.

(51) Int. Cl.
*H01L 21/285* (2006.01)

(52) U.S. Cl.
USPC ............................. 438/656; 257/E21.161

(58) Field of Classification Search
None
See application file for complete search history.

(56) References Cited

U.S. PATENT DOCUMENTS 6,555,183 B2    4/2003  Wang et al.

*Primary Examiner* — Seahvosh Nikmanesh
(74) *Attorney, Agent, or Firm* — Jacqueline J. Garner; Wade J. Brady, III; Frederick J. Telecky, Jr.

(57) ABSTRACT

A multi-layer TiN film with reduced tensile stress and discontinuous grain structure, and a method of fabricating the TiN film are disclosed. The TiN layers are formed by PVD or IMP in a nitrogen plasma. Tensile stress in a center layer of the film is reduced by increasing $N_2$ gas flow to the nitrogen plasma, resulting in a Ti:N stoichiometry between 1:2.1 to 1:2.3. TiN films thicker than 40 nanometers without cracks are attained by the disclosed process.

10 Claims, 3 Drawing Sheets

MODULATED DEPOSITION PROCESS FOR STRESS CONTROL IN THICK TIN FILMS

CROSS REFERENCE TO RELATED APPLICATIONS

This application is a continuation of U.S. Nonprovisional patent application Ser. No. 12/537,306, filed Aug. 7, 2009, and claims the priority of U.S. provisional application Ser. No. 61/087,041, filed Aug. 7, 2008, the contents of which are herein incorporated by reference in its entirety.

FIELD OF THE INVENTION

This invention relates to the field of integrated circuits. More particularly, this invention relates to improved titanium nitride films in integrated circuits.

BACKGROUND OF THE INVENTION

Titanium nitride (TiN) films are used in integrated circuits (ICs) for a variety of purposes, including capacitor plates and metal interconnect liners. TiN films exhibit low electrical resistivity and good adhesion to dielectric materials commonly used in ICs, and provide good diffusion barriers to metals commonly used in ICs, such as aluminum and copper. TiN has high tensile stress that can cause cracks in films thicker than 40 nanometers.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of forming a TiN film of three or more layers, in which one or more central layers has lower tensile stress than outer layers and a discontinuous grain structure from the outer layers.

DETAILED DESCRIPTION

Figure 1A:
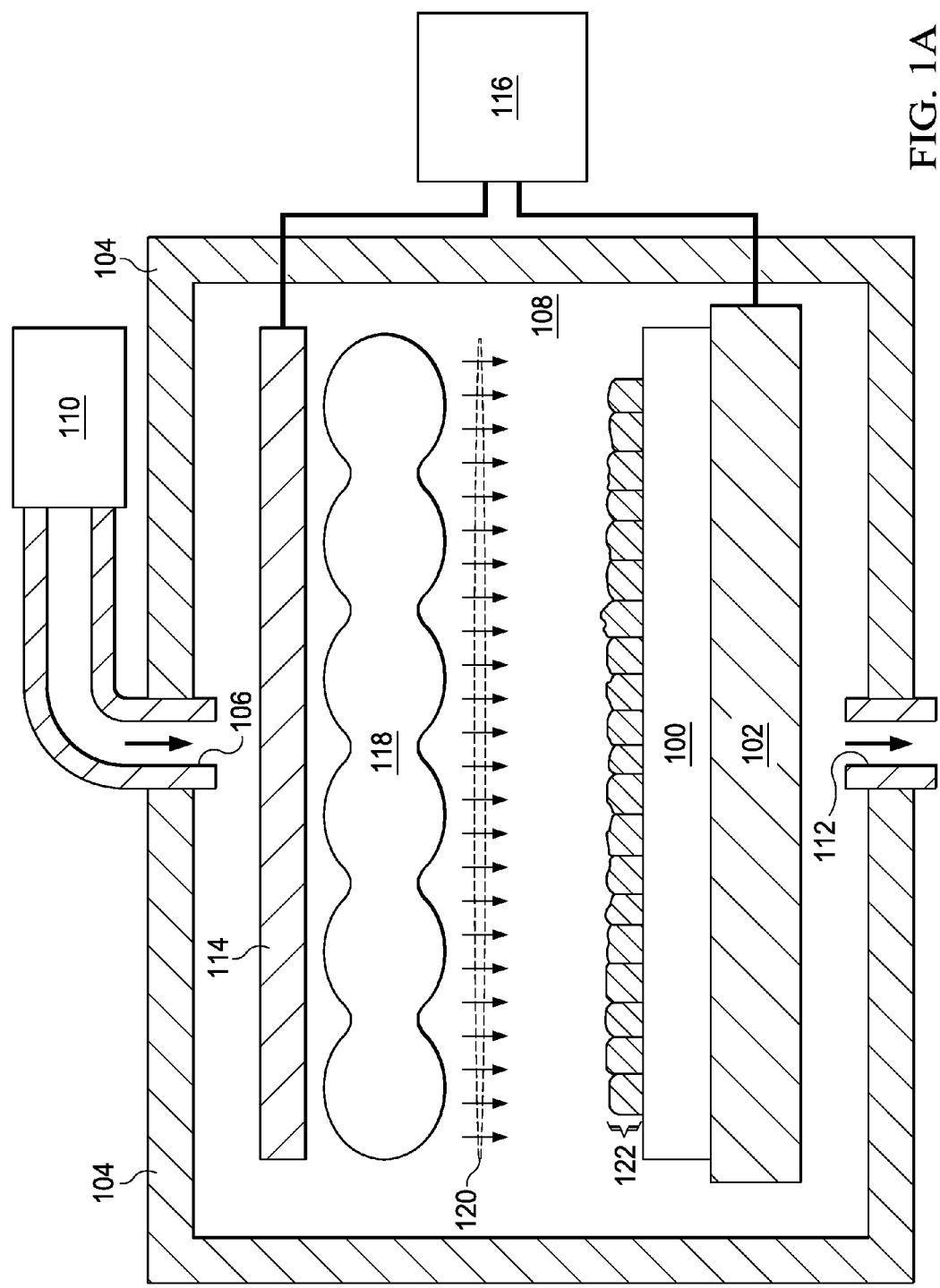
FIG. 1A through FIG. 1C are cross-sectional views of successive stages of formation of a multi-layer TiN film formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The need for a titanium nitride (TiN) film in an integrated circuit (IC) thicker than 40 nanometers that is resistant to cracking while maintaining good adhesion to dielectric materials, low electrical resistivity and good diffusion barrier properties, is addressed by the instant invention, which provides a method of forming a multi-layer TiN film of three or more layers, in which one or more central layers has lower tensile stress than outer layers and a discontinuous grain structure from the outer layers. All layers of the inventive film may be formed in a common reaction chamber.

Figure 1B:
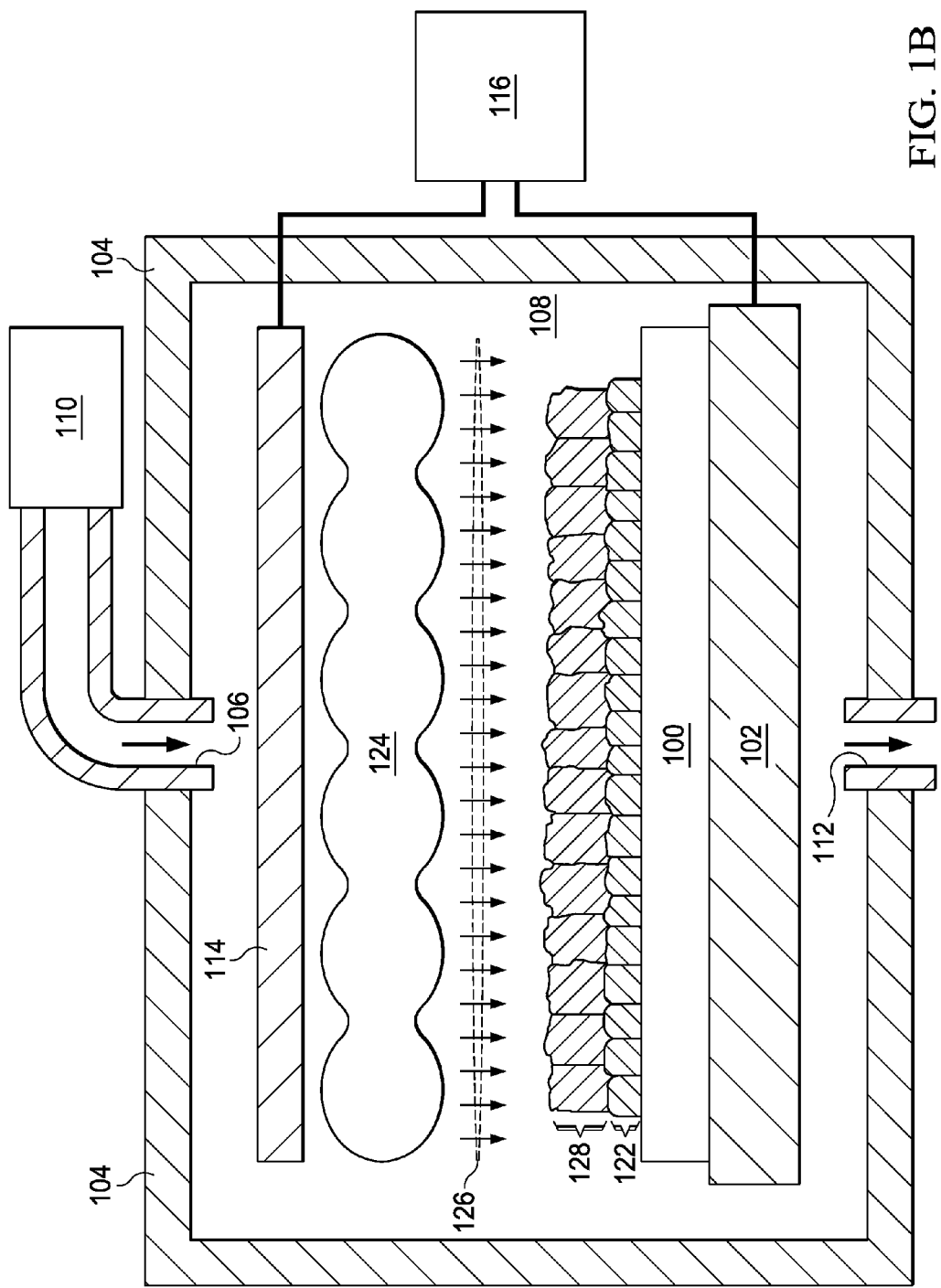
Figure 1C:
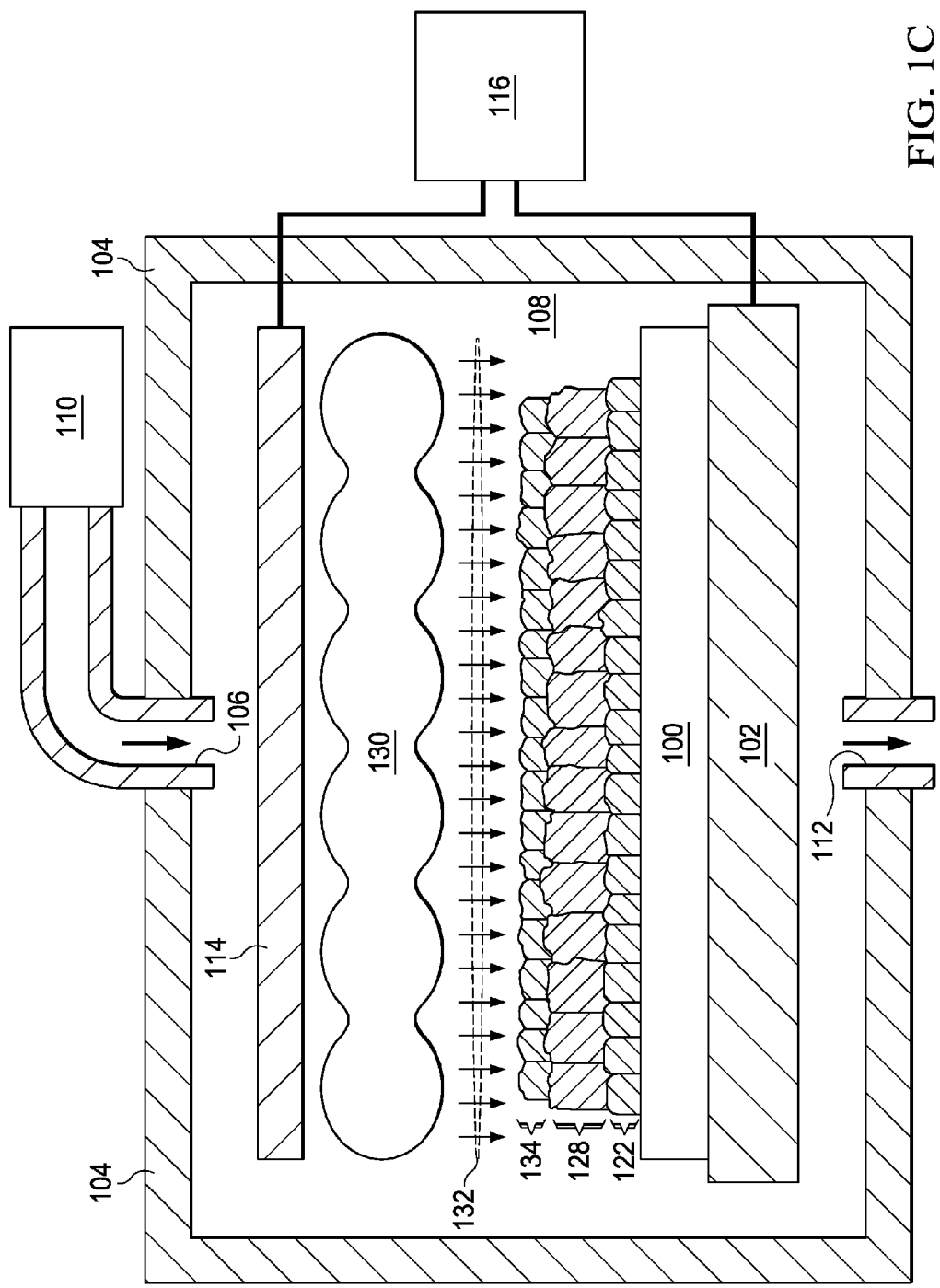

A multi-layer TiN film having the properties recited above may be formed for example as depicted in FIG. 1A through FIG. 1C, which are cross-sectional views of successive stages of formation of a multi-layer TiN film. Referring to FIG. 1A, a first TiN layer (122) of the multi-layer TiN film is formed on an IC substrate (100), typically a silicon wafer, but possibly a wafer of another semiconductor material, or any other substrate suitable for fabricating ICs. The first TiN layer (122) exhibits an adhesion to the top surface of the substrate (100) within a desired range of adhesion values and an electrical resistivity within a desired range of electrical resistivity values. A stoichiometry, Ti:N, of the first TiN layer (122) is between 1:1.05 and 1:1.15. A preferred thickness of the first TiN layer (122) is between 5 and 10 nanometers.

The first TiN layer (122) may, for example, be formed by placing the IC substrate (100) on a substrate platen (102) in a deposition chamber (104), which may be part of a processing tool with more than one chamber. The substrate platen (102) maintains a temperature of the substrate (100) between 30 C and 300 C during a deposition process. An entry port (106) in the deposition chamber (104) admits $N_2$ gas into an interior region (108) of the deposition chamber (104). A first flow rate of $N_2$ gas, between 30 and 150 sccm, into the interior region (108) is controlled by a gas flow controller (110). An exit port (112) in the deposition chamber (104) is connected to an exhaust system, not shown in FIG. 1A for clarity, which may include a pump, to remove gas from the interior region (108). A first pressure level of gas in the interior region (108), between 0.5 and 5 millitorr, is obtained by a combination of the first flow rate of $N_2$ gas into the deposition chamber (104), a first flow impedance of the exit port (110) and a pressure drop at the exit port (112) provided by the exhaust system. A titanium target (114) is mounted in the interior region (108) above the substrate platen (102). An RF power supply (116), with DC bias capability, is connected to the titanium target (114) and the substrate platen (102). A first level of RF power, between 0.5 and 1.5 watts/cm$^2$, is applied to $N_2$ gas in the interior region (108) by the RF power supply (116), forming a first plasma (118) in the interior region (108) between the titanium target (114) and the substrate (100). A first set of titanium atoms (120) is dislodged from the titanium target (114) by the first plasma (118) and travels to the substrate (100), where the titanium atoms react with nitrogen atoms from the $N_2$ gas provided by the gas flow controller (110) to form a first TiN layer (122) at a rate between 0.5 and 3 nanometers/second on a top surface of the substrate (100), in a process commonly known as physical vapor deposition (PVD). The first $N_2$ gas flow rate into the deposition chamber (104), the first pressure level in the interior region (108) of the deposition chamber (104), the temperature of the substrate (100), the first level of RF power applied by the RF power supply (116) and a first DC bias of the RF power supply (116) are adjusted such that the first TiN layer (122) exhibits an adhesion to the top surface of the substrate (100) within a desired range of adhesion values and an electrical resistivity within a desired range of electrical resistivity values. As discussed above, the stoichiometry, Ti:N, of the first TiN layer (122) is between 1:1.05 and 1:1.15 and the preferred thickness of the first TiN layer (122) is between 5 and 10 nanometers.

Referring to FIG. 1B, a second TiN layer (128) of the multi-layer TiN film is formed on the first TiN layer (122). The second TiN layer (128) exhibits a level of tensile stress 25 to 50 percent less than the first TiN layer (122). Grains of the second TiN layer (128) are discontinuous from grains of the first TiN layer (122), which is advantageous because a discontinuous grain structure increases resistance to diffusion of metal atoms such as copper and aluminum through the inventive TiN film. A stoichiometry of the second TiN layer (128) is between 1:2.1 and 1:2.3. A preferred thickness of the second TiN layer (122) is greater than 20 nanometers.

The second TiN layer (128) may, for example, be formed using the following process. FIG. 1B depicts the substrate (100) in the same deposition chamber (104) used to form the first TiN layer (122), but it is within the scope of the instant embodiment to form the second TiN layer of the multi-layer TiN film in a separate deposition chamber. A second $N_2$ gas flow rate between 10 and 25 percent higher than the first $N_2$ gas flow rate is provided by the gas flow controller (110). A second pressure level of gas in the interior region (108) of the deposition chamber (104) is established to be substantially the same as the first pressure level of gas, possibly by adjusting a flow impedance of the exit port (112). A second level of RF power provided by the RF power supply (116) is established to be substantially the same as the first level of RF power, and a second DC bias is established to be substantially the same as the first DC bias, forming a second plasma (124) in the interior region (108) between the titanium target (114) and the substrate (100). A second set of titanium atoms (126) is dislodged from the titanium target (114) by the second plasma (124) and travels to the substrate (100), where the titanium atoms react with nitrogen atoms from the $N_2$ gas provided by the gas flow controller (110) to form a second TiN layer (128) on a top surface of the first TiN layer (122). The second $N_2$ gas flow rate into the deposition chamber (104), the second pressure level in the interior region (108) of the deposition chamber (104), the temperature of the substrate (100), the second level of RF power applied by the RF power supply (116) and the second DC bias of the RF power supply (116) are adjusted such that the second TiN layer (128) exhibits a level of tensile stress 25 to 50 percent less than the first TiN layer (122). As discussed above, grains of the second TiN layer (128) are discontinuous for grains of the first TiN layer (122), which is advantageous because a discontinuous grain structure increases resistance to diffusion of metal atoms such as copper and aluminum through the inventive TiN film, the stoichiometry of the second TiN layer (128) is between 1:2.1 and 1:2.3, and the preferred thickness of the second TiN layer (122) is greater than 20 nanometers.

Referring to FIG. 1C, a third TiN layer (134) of the multi-layer TiN film is formed on the second TiN layer (128). The third TiN layer (134) exhibits an adhesion to a subsequent layer to be formed on a top surface of the inventive TiN film within a desired range of adhesion values and an electrical resistivity within a desired range of electrical resistivity values. Grains of the third TiN layer (134) are discontinuous for grains of the second TiN layer (128), which is also advantageous because a second level of grain structure discontinuity further increases resistance to diffusion of metal atoms such as copper and aluminum through the inventive TiN film. A stoichiometry of the third TiN layer (134) is between 1:1.05 and 1:1.15. A preferred thickness of the third TiN layer (134) is between 5 and 10 nanometers.

The third TiN layer (134) may, for example, be formed using the following process. FIG. 1C depicts the substrate (100) in the same deposition chamber (104) used to form the first TiN layer (122) and the second TiN layer (128), but it is within the scope of the instant embodiment to form the third TiN layer of the multi-layer TiN film in a separate deposition chamber. A third $N_2$ gas flow rate is provided by the gas flow controller (110) which is substantially the same as the first $N_2$ gas flow rate. A third pressure level of gas in the interior region (108) of the deposition chamber (104) is established, possibly by readjusting a flow impedance of the exit port (112), to be substantially the same as the first pressure level of gas. A third level of RF power and a third DC bias provided by the RF power supply (116) are established to be substantially the same as the first level of RF power and the first DC bias, respectively, forming a third plasma (130) in the interior region (108) between the titanium target (114) and the substrate (100). A third set of titanium atoms (132) is dislodged from the titanium target (114) by the third plasma (130) and travels to the substrate (100), where the titanium atoms react with nitrogen atoms from the $N_2$ gas provided by the gas flow controller (110) to form a third TiN layer (134) on a top surface of the second TiN layer (128). The third $N_2$ gas flow rate into the deposition chamber (104), the third pressure level in the interior region (108) of the deposition chamber (104), the temperature of the substrate (100), the third level of RF power applied by the RF power supply (116) and the third DC bias of the RF power supply (116) are adjusted such that the third TiN layer (134) exhibits an adhesion to a subsequent layer to be formed on a top surface of the inventive TiN film within a desired range of adhesion values and an electrical resistivity within a desired range of electrical resistivity values. As discussed above, grains of the third TiN layer (134) are discontinuous for grains of the second TiN layer (128), which is also advantageous because a second level of grain structure discontinuity further increases resistance to diffusion of metal atoms such as copper and aluminum through the inventive TiN film. As discussed above, the stoichiometry of the third TiN layer (134) is between 1:1.05 and 1:1.15, and the preferred thickness of the third TiN layer (134) is between 5 and 10 nanometers.

An alternate process for dislodging the first, second and third sets of titanium atoms from the titanium target and reacting the titanium atoms with nitrogen atoms from the $N_2$ gas is commonly known as ionized metal plasma (IMP) deposition, and is performed at pressures between 30 and 90 millitorr.

It is within the scope of the instant invention to form more than one TiN layer with reduced tensile stress between formation of the first TiN layer and formation of the last TiN layer.

It is within the scope of the instant invention to form one or more layers of the inventive TiN film in separate deposition chambers.

What is claimed is:
1. A method of forming a titanium nitride (TiN) film on a substrate, comprising the steps of:
   forming a first TiN layer with a first grain structure on a top surface of said substrate;
   forming a second TiN layer with a second grain structure and with less tensile stress than said first TiN layer on a top surface of said first TiN layer;
   forming a third TiN layer with a third grain structure on a top surface of said second TiN layer, wherein:

said first TiN layer is between 5 and 10 nanometers thick;
said second TiN layer is greater than 20 nanometers thick; and
said third TiN layer is between 5 and 10 nanometers thick.

2. The method of claim 1, in which said second TiN layer has between 25 and 50 percent less tensile stress than said first TiN layer.

3. The method of claim 1, in which said first TiN layer, said second TiN layer, and said third TiN layer are formed in a single deposition chamber.

4. The method of claim 1, in which:
said step of forming said first TiN layer further comprises the steps of:
flowing a first quantity of $N_2$ gas into said deposition chamber at a flow rate between 30 and 150 sccm;
maintaining a first pressure in said deposition chamber between 0.5 and 5 millitorr;
forming a first plasma in said first quantity of $N_2$ gas by providing between 0.5 and 1.5 watts/cm$^2$ of RF power to said first quantity of $N_2$ gas; and
depositing said first TiN layer at a rate between 0.5 and 3 nanometers/second;
said step of forming said second TiN layer further comprises the steps of:
flowing a second quantity of $N_2$ gas into said deposition chamber at a flow rate between 10 and 25 percent higher than said first quantity of $N_2$ gas;
maintaining a second pressure in said deposition chamber between 0.5 and 5 millitorr;
forming a second plasma in said second quantity of $N_2$ gas by providing between 0.5 and 1.5 watts/cm$^2$ of RF power to said second quantity of $N_2$ gas; and
depositing said second TiN layer at a rate between 0.5 and 3 nanometers/second; and
said step of forming said third TiN layer further comprises the steps of:
flowing a third quantity of $N_2$ gas into said deposition chamber at a flow rate between 30 and 150 sccm;
maintaining a third pressure in said deposition chamber between 0.5 and 5 millitorr;
forming a third plasma in said third quantity of $N_2$ gas by providing between 0.5 and 1.5 watts/cm$^2$ of RF power to said third quantity of $N_2$ gas; and
depositing said third TiN layer at a rate between 0.5 and 3 nanometers/second.

5. A method of forming a titanium nitride (TiN) film on a substrate, comprising the steps of:
forming a first TiN layer with a first grain structure on a top surface of said substrate;
forming a second TiN layer with a second grain structure and with less tensile stress than said first TiN layer on a top surface of said first TiN layer;
forming a third TiN layer with a third grain structure on a top surface of said second TiN layer; and
forming a fourth TiN layer with a fourth grain structure and with less tensile stress than said first TiN layer on a top surface of said second TiN layer, before said step of forming said third TiN layer, and in which said third TiN layer is formed on a top surface of said fourth TiN layer.

6. A method of forming an IC, comprising the steps of:
providing a semiconductor substrate;
forming a TiN film greater than 40 nanometers thick by a process further comprising the steps of:
forming a first TiN layer with a first grain structure on a top surface of said semiconductor substrate;
forming a second TiN layer with a second grain structure and with less tensile stress than said first TiN layer on a top surface of said first TiN layer;
forming a third TiN layer with a third grain structure on a top surface of said second TiN layer, wherein:
said first TiN layer is between 5 and 10 nanometers thick;
said second TiN layer is greater than 20 nanometers thick; and
said third TiN layer is between 5 and 10 nanometers thick.

7. The method of claim 6, in which said second TiN layer has between 25 and 50 percent less tensile stress than said first TiN layer.

8. The method of claim 7, in which said first TiN layer, said second TiN layer, and said third TiN layer are formed in a single deposition chamber.

9. The method of claim 8, in which:
said step of forming said first TiN layer further comprises the steps of:
flowing a first quantity of $N_2$ gas into said deposition chamber at a flow rate between 30 and 150 sccm;
maintaining a first pressure in said deposition chamber between 0.5 and 5 millitorr;
forming a first plasma in said first quantity of $N_2$ gas by providing between 0.5 and 1.5 watts/cm$^2$ of RF power to said first quantity of $N_2$ gas; and
depositing said first TiN layer at a rate between 0.5 and 3 nanometers/second;
said step of forming said second TiN layer further comprises the steps of:
flowing a second quantity of $N_2$ gas into said deposition chamber at a flow rate between 10 and 25 percent higher than said first quantity of $N_2$ gas;
maintaining a second pressure in said deposition chamber between 0.5 and 5 millitorr;
forming a second plasma in said second quantity of $N_2$ gas by providing between 0.5 and 1.5 watts/cm$^2$ of RF power to said second quantity of $N_2$ gas; and
depositing said second TiN layer at a rate between 0.5 and 3 nanometers/second; and
said step of forming said third TiN layer further comprises the steps of:
flowing a third quantity of $N_2$ gas into said deposition chamber at a flow rate between 30 and 150 sccm;
maintaining a third pressure in said deposition chamber between 0.5 and 5 millitorr;
forming a third plasma in said third quantity of $N_2$ gas by providing between 0.5 and 1.5 watts/cm$^2$ of RF power to said third quantity of $N_2$ gas; and
depositing said third TiN layer at a rate between 0.5 and 3 nanometers/second.

10. The method of claim 9, further comprising the step of forming a fourth TiN layer with a fourth grain structure and with less tensile stress than said first TiN layer on a top surface of said second TiN layer, before said step of forming said third TiN layer, and in which said third TiN layer is formed on a top surface of said fourth TiN layer.

* * * * *